(12) United States Patent
Rugg

(10) Patent No.: US 9,715,904 B2
(45) Date of Patent: Jul. 25, 2017

(54) DISSIPATING HEAT DURING DEVICE OPERATION

(71) Applicant: Seagate Technology LLC, Cupertino, CA (US)

(72) Inventor: William L. Rugg, Longmont, CO (US)

(73) Assignee: Seagate Technology LLC, Cupertino, CA (US)

(*) Notice: Subject to any disclaimer, the term of this patent is extended or adjusted under 35 U.S.C. 154(b) by 33 days.

(21) Appl. No.: 15/048,474

(22) Filed: Feb. 19, 2016

(65) Prior Publication Data

US 2016/0172008 A1   Jun. 16, 2016

Related U.S. Application Data

(63) Continuation of application No. 14/160,161, filed on Jan. 21, 2014, now Pat. No. 9,282,681.

(51) Int. Cl.

| | |
|---|---|
| *G06F 1/20* | (2006.01) |
| *H01L 23/373* | (2006.01) |
| *G11B 33/14* | (2006.01) |
| *H05K 7/20* | (2006.01) |
| *H01L 23/40* | (2006.01) |

(52) U.S. Cl.
CPC ........ *G11B 33/1426* (2013.01); *G11B 33/142* (2013.01); *H01L 23/373* (2013.01); *H05K 7/2039* (2013.01); *H05K 7/20518* (2013.01); *H01L 2023/4068* (2013.01)

(58) Field of Classification Search
CPC .......... G06F 1/20–1/206; H05K 7/20–7/2099; H05K 7/20518; H01L 23/34–23/4735
See application file for complete search history.

(56) References Cited

U.S. PATENT DOCUMENTS

| | | | |
|---|---|---|---|
| 6,523,608 B1 | 2/2003 | Solbrekken et al. | |
| 6,570,086 B1 * | 5/2003 | Shimoji | H05K 9/0024 174/377 |
| 6,653,741 B2 | 11/2003 | Sreeram et al. | |
| 6,859,364 B2 * | 2/2005 | Yuasa | A01N 25/10 165/104.33 |
| 6,980,418 B1 * | 12/2005 | Seeger | G06F 1/203 126/684 |
| 6,982,874 B2 | 1/2006 | Smalc | |
| 7,042,723 B2 | 5/2006 | Espersen et al. | |
| 7,292,441 B2 | 11/2007 | Smalc | |

(Continued)

*Primary Examiner* — Robert J Hoffberg

(74) *Attorney, Agent, or Firm* — Hall Estill Attornyes at Law

(57) ABSTRACT

Apparatus for dissipating heat during the operation of a device. In accordance with some embodiments, the apparatus compares spaced-apart first and second heat sources. A thermally conductive plate is disposed between the first and second heat sources. A thermal interface layer is contactingly disposed between the plate and the first heat source, and has a relatively higher thermal conductivity so that heat generated by the first heat source passes through the thermal interface layer and to the plate. A thermal barrier layer is contactingly disposed between the plate and the second heat source to mechanically support the plate relative to the second heat source. The thermal barrier layer has a relatively lower thermal conductivity to thermally isolate the conductive plate from the second heat source.

20 Claims, 4 Drawing Sheets

(56) References Cited

U.S. PATENT DOCUMENTS

| | | | |
|---|---|---|---|
| 7,330,354 B2 | 2/2008 | Watanabe | |
| 7,616,446 B2 * | 11/2009 | Watanabe | G06F 1/203 174/252 |
| 7,637,632 B2 * | 12/2009 | Wang | G03B 21/145 165/80.3 |
| 7,839,630 B2 | 11/2010 | Hwang | |
| 7,955,900 B2 | 6/2011 | Jadhav et al. | |
| 8,031,470 B2 | 10/2011 | Nelson | |
| 8,184,439 B2 | 5/2012 | Baek | |
| 8,217,272 B2 * | 7/2012 | Choudhury | H01L 23/3677 174/250 |
| 8,477,499 B2 | 7/2013 | Hill | |
| 8,498,127 B2 | 7/2013 | Kirk | |
| 9,277,675 B2 * | 3/2016 | Fujiwara | H05K 7/20336 |
| 9,282,681 B2 * | 3/2016 | Rugg | H05K 7/20518 |
| 2004/0014317 A1 | 1/2004 | Sakamoto et al. | |
| 2008/0158817 A1 * | 7/2008 | Tsunoda | G06F 1/203 361/697 |
| 2010/0112360 A1 | 5/2010 | Delano | |
| 2011/0122574 A1 * | 5/2011 | Tsunoda | G06F 1/203 361/679.54 |
| 2011/0128706 A1 * | 6/2011 | Tsunoda | G06F 1/203 361/704 |
| 2012/0063103 A1 | 3/2012 | Kirk | |
| 2016/0150679 A1 * | 5/2016 | Cheng | G06F 1/20 361/709 |

\* cited by examiner

DISSIPATING HEAT DURING DEVICE OPERATION

RELATED APPLICATION

The present application is a continuation of copending U.S. patent application Ser. No. 14/160,161 filed Jan. 21, 2014 which issues as U.S. Pat. No. 9,282,681 on Mar. 8, 2016.

SUMMARY

Various embodiments of the present disclosure are generally directed to an apparatus which dissipates heat during operation of a device.

In accordance with some embodiments, the apparatus compares spaced-apart first and second heat sources. A thermally conductive plate is disposed between the first and second heat sources. A thermal interface layer is contactingly disposed between the plate and the first heat source, and has a relatively higher thermal conductivity so that heat generated by the first heat source passes through the thermal interface layer and to the plate. A thermal barrier layer is contactingly disposed between the plate and the second heat source to mechanically support the plate relative to the second heat source. The thermal barrier layer has a relatively lower thermal conductivity to thermally isolate the conductive plate from the second heat source.

These plus other features and aspects which characterize various embodiments of the present disclosure can be understood in view of the following detailed discussion and the accompanying drawings.

DETAILED DESCRIPTION

Electronic devices can be susceptible to thermal effects during operation due to the generation of waste heat. If such heat is not properly dissipated (transferred) away from a device, the device may undergo undesired localized increases in operational temperature which, in turn, may affect device operation and reliability.

The transfer of heat from a device can be carried out by various means such as conduction, convection and/or radiation. Generally, heat conduction describes the transfer of heat energy through a medium. Heat is a form of energy that manifests as molecular vibration, and so heat conduction generally involves kinetic energy transfer from one molecule to another within a medium where the molecules otherwise remain substantially fixed in place.

By contrast, heat convection generally involves heat transfer through a liquid or gas through the displacement (e.g., circulation, migration, etc.) of molecules from a relatively higher temperature region to a relatively lower temperature region. Heat radiation generally involves the transmission of heat in the form of electromagnetic waves, such as infrared waves, which are emitted from a first set of molecules and absorbed by a second set of molecules at a distance from the first set.

Various embodiments of the present disclosure are generally directed to an apparatus for facilitating heat dissipation during the operation of a device. As explained below, the apparatus includes spaced-apart first and second heat sources and a thermally conductive plate disposed between the heat sources. A thermal interface layer is contactingly disposed between the conductive plate and the first heat source. The thermal interface layer has a relatively high thermal conductivity so that heat generated by the first heat source passes through the thermal interface material and to the conductive plate.

A thermal barrier layer is contactingly disposed between the conductive plate and the second heat source. The thermal barrier layer has a relatively low thermal conductivity as compared to the thermal conductivity of the thermal interface layer. The thermal barrier layer mechanically supports the plate relative to the second heat source, and thermally isolates the plate from the second heat source.

In some embodiments, the first heat source is an electronic component supported on a printed circuit board assembly (PCBA) of a data storage device, and the second heat source is a housing of the data storage device that houses at least one heat generating electrical component, such as a motor, a solid-state memory, etc. In further embodiments, the thermally conductive plate is elongated and includes cooling fins to facilitate convection of heat transferred thereto through the thermal interface material.

Figure 1:
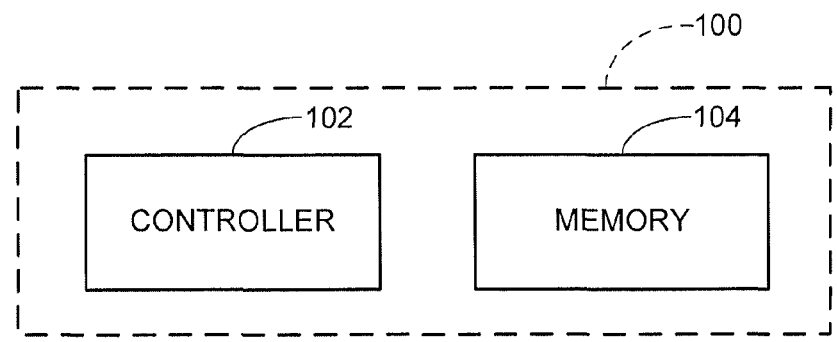
FIG. 1 provides a functional block representation of a data storage device in accordance with some embodiments of the present disclosure.

These and other features of various embodiments can be understood beginning with a review of FIG. 1 which provides a functional block representation of a data storage device 100. Please note that the presentation of a data storage device is merely by way of illustration and is not limiting to the scope of the present disclosure.

The device 100 includes a controller 102 and a memory 104. The controller 102 can take a variety of forms such as a hardware based control circuit or a general purpose programmable processor having suitable programming to provide top level control for the device. The memory 104 can take a variety of forms such as rotatable magnetic or optical data recording media (discs), solid-state flash memory, hybrid memory modules (e.g., both rotatable and solid-state), etc.

Figure 2:
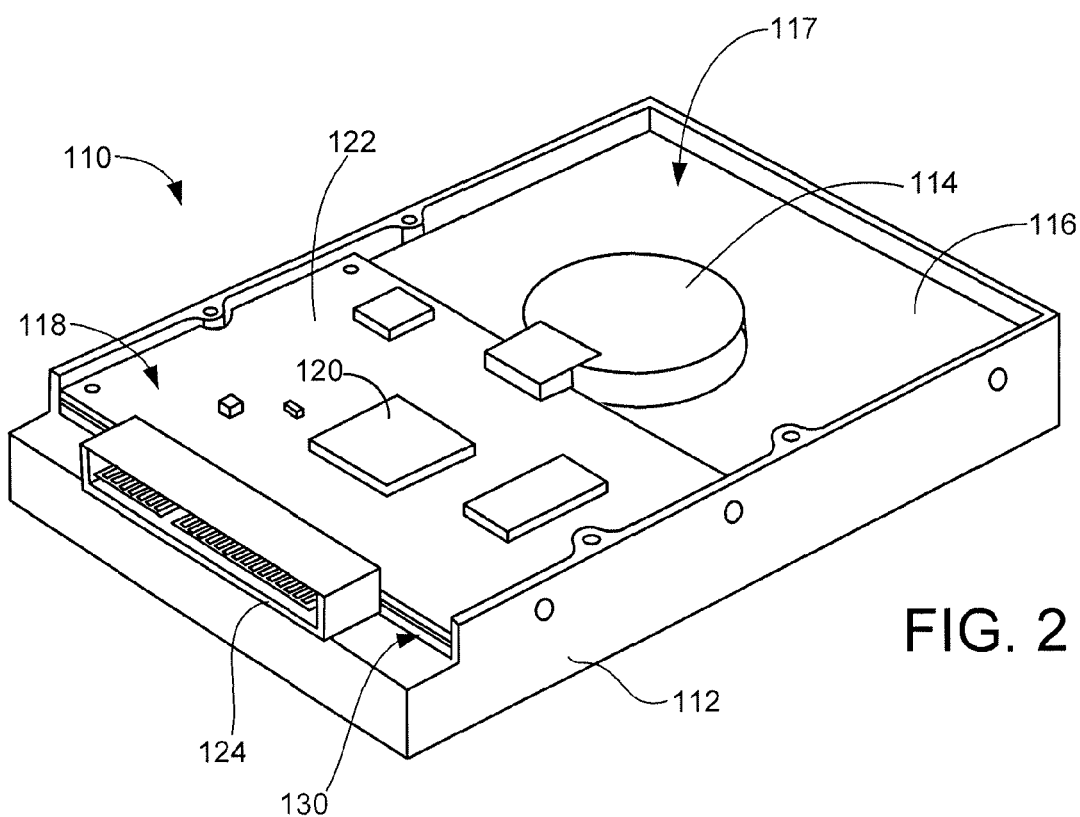
FIG. 2 is a perspective view of the storage device of FIG. 1 in accordance with some embodiments.

FIG. 2 is a perspective underside representation of a data storage device 110 which corresponds to the device 100 of FIG. 1 in accordance with some embodiments. The data storage device 110 is characterized as a hard disc drive (HDD) which employs magnetic recording media to store data from a host device.

A housing 112 encloses various aspects of the device 110 including one or more magnetic recording discs connected to a spindle motor, a preamplifier/driver circuit, transducer heads, a voice coil motor, etc. A boss projection 114 extends from a lower surface 116 of the housing 112 to accommodate the spindle motor used to rotate the discs. For reference, the housing 112 and those aspects enclosed therein are sometimes referred to as a head-disc assembly (HDA) 117.

A rigid printed circuit board assembly (PCBA) 118 is secured to the HDA 117 and incorporates various electronic modules of the device 110 used to control the HDA 117, such as a programmable controller, an interface circuit, a buffer, read and write channels, servo circuit, etc. These and other modules are represented by various integrated circuit components 120 which are affixed to a rigid, multi-layer substrate 122 (also referred to as a "printed circuit board," or "PCB"). A communication assembly (not visible in FIG. 2) such as a flex circuit or bulkhead connector provides electrical interconnection between the HDA 117 and the PCBA 118. An interface connector 124 of the PCBA 118 enables interconnection of the device 100 with a host (not separately shown).

The PCBA 118 is shown to be substantially rectangular for simplicity of illustration. Other shapes and areal extents of the PCBA 118 can be used, including irregular shapes that at least partially surround the boss projection 114. In some cases, the PCBA 118 may substantially cover the entire areal extent of the lower surface 116 of the housing 112, or a substantial portion thereof.

The storage device 110 further comprises a thermal dissipation assembly 130 disposed between the HDA 117 and the PCBA 118, a portion of which is visible in FIG. 2. Details concerning the thermal dissipation assembly 130 will be presented below, but at this point it will be understood that the thermal dissipation assembly 130 secures the PCBA 118 to the housing 112, conducts heat away from the PCBA 118 during device operation, and thermally isolates the PCBA 118 from the HDA 117. In this way, heat generated by the PCBA 118 can be efficiently removed from the PCBA, and heat generated by the HDA 117 will not tend to increase the temperature of the PCBA (and vice versa). For reference, the PCBA 118 is sometimes referred to herein as an exemplary "first heat source" and the HDA 117 is sometimes referred to herein as an exemplary "second heat source."

Figure 3A:
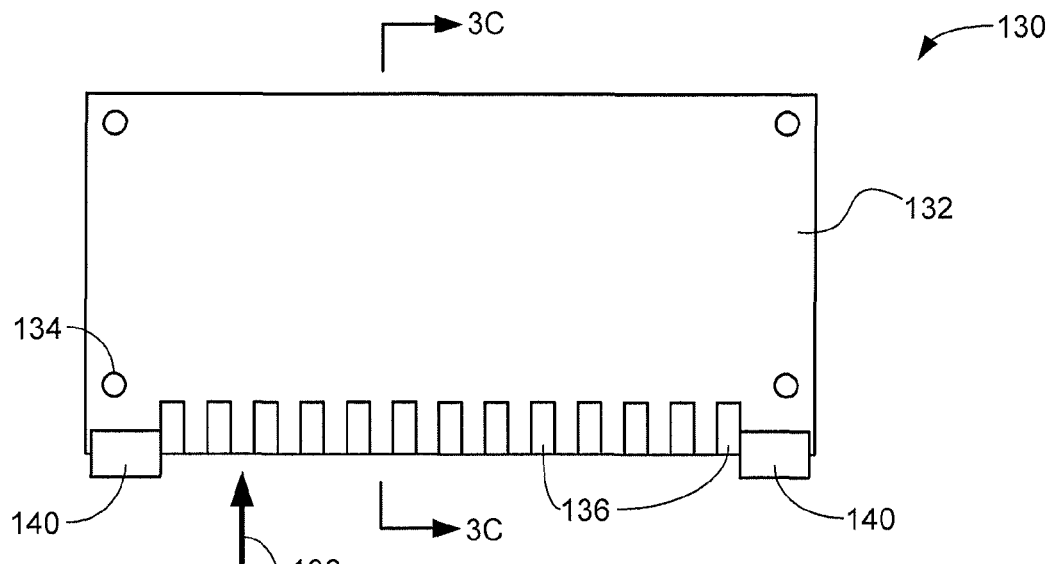
FIGS. 3A-3C depict a thermal dissipation plate of the storage device of FIG. 2 in accordance with some embodiments.
Figure 3B:
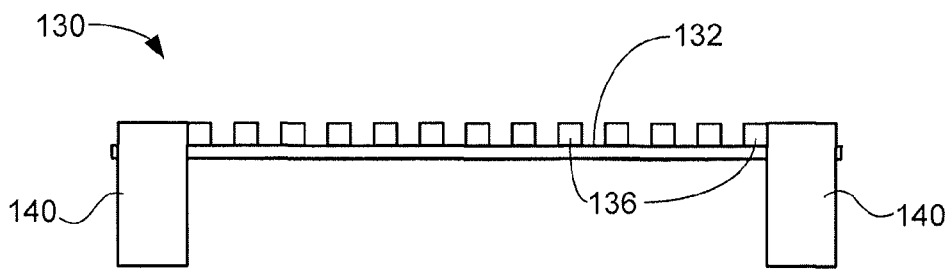
Figure 3C:
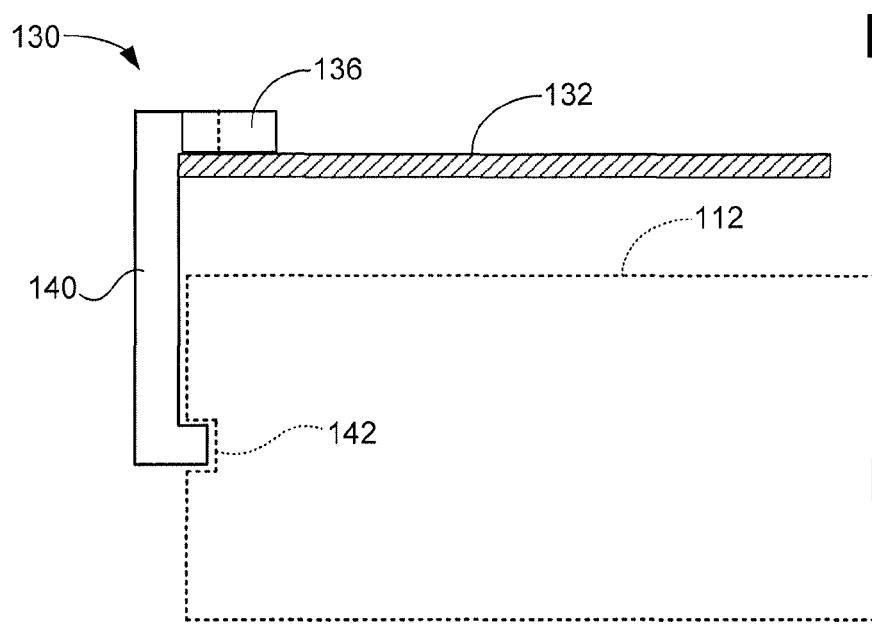

FIGS. 3A-3C depict a thermal dissipation (thermally conductive) plate 132 of the thermal dissipation assembly 130 of FIG. 2 in accordance with some embodiments. FIG. 3A is a top view of the plate 132, FIG. 3B is a front view of the plate 132, and FIG. 3C is a side cross-sectional view of the plate 132 along lines 3C-3C in FIG. 3A.

The thermally conductive plate 132 is generally rectangular in shape and nominally corresponds to the areal extent of the PCBA 118 of FIG. 2. However, the plate 132 can take any suitable size or shape, including sizes that are larger than or smaller than the PCBA 118. In some embodiments, the plate 132 extends to substantially cover the entire lower surface 116 of the housing (see FIG. 2) or a substantial portion thereof. Notches, cutouts and other features can be supplied as required; for example, an aperture (not shown) may be supplied to facilitate a connector that establishes electrical interconnection of the circuitry on the PCBA 118 with the HDA 117, etc.

The plate 132 is formed of a thermally conductive material, such as metal(s) or metal alloy(s), and is generally rigid to provide a mechanical support for the PCBA 118. In some embodiments, the plate 132 is a layer of highly thermally conductive aluminum with a nominal thickness on the order of about 0.030 inches (30 mils) and a thermal conductivity of greater than about 100 W/mK (watts/meter*degree Kelvin). While the plate 132 is shown to have a substantially uniform thickness, localized relief and boss areas of varying thicknesses can be provided on the plate as required to adapt to contours of adjacent elements, provide mechanical rigidity, etc.

Other operational benefits may be supplied by the plate such as localized electromagnetic interference (EMI) shielding. The plate 132 may be formed using any number of suitable processes such as stamping, rolling, casting, machining, molding, etc. Multiple pieces may be adjoined through welding, riveting, heat staking, etc. to provide a unitary plate. As used herein, a material will be considered to be thermally conductive if the material is provided with a thermal conductivity of at least about 1.0 W/mK. It is contemplated that the plate will be thermally conductive with a thermal conductivity of about 1-300 W/mK or more.

Threaded apertures 134 extend through the plate 132 at suitable locations to accommodate standoff/fastener assemblies (not separately shown) used to secure the PCBA 118 to the plate. A series of spaced-apart cooling fins (projections) 136 extend along a leading edge of the plate. The cooling fins 136 facilitate convective cooling of the plate responsive to air currents (depicted by arrow 138) that pass adjacent the plate 132. The air currents may be generated through natural convection or through a forced air mechanism such as a nearby electric cooling fan, etc. The use of cooling fins is contemplated but not required.

A pair of hook-shaped attachment members 140 are used to secure the plate 132 to the housing 112. The attachment members 140 take the form of hinge flanges which engage corresponding slots 142 in the housing 112 (see FIG. 3C) to secure one end of the plate 132. The other end of the plate 132 can be secured using standoffs, adhesives, etc. Other attachment configurations can be used to secure the plate 132 to the housing 112 that do not utilize the hook-shaped attachment members 140.

Figure 4:
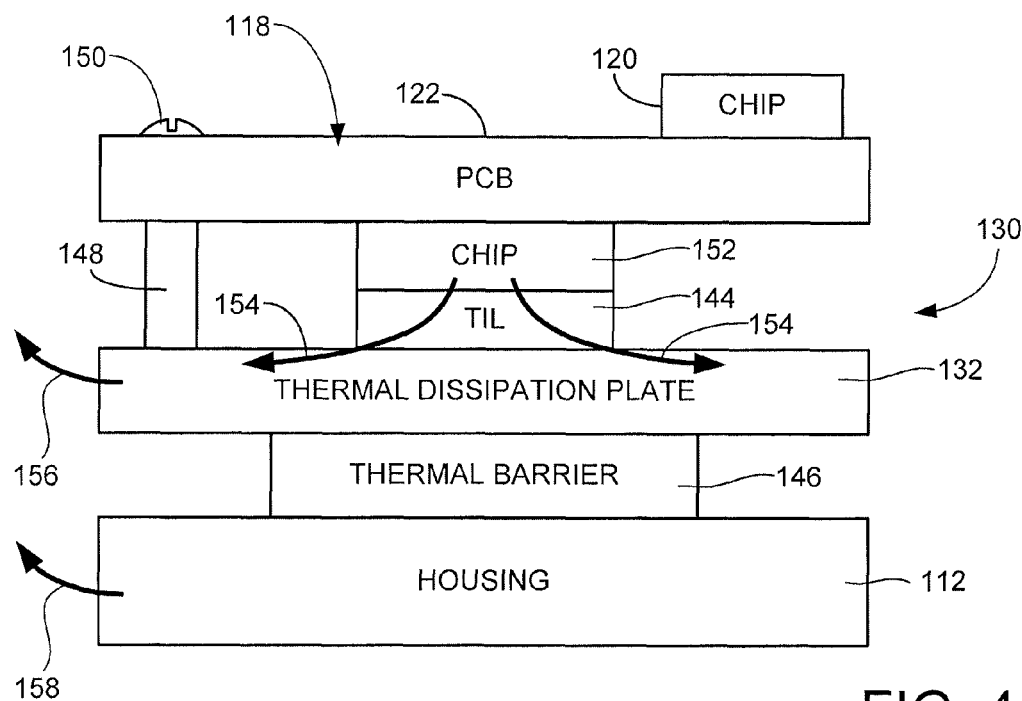
FIG. 4 provides a schematic representation of a thermal dissipation scheme in accordance with some embodiments.

FIG. 4 represents of the thermal dissipation assembly 130 in accordance with some embodiments. The diagram is schematic in nature so that the various thicknesses, aspect ratios, etc. of the depicted components are not drawn to scale. The thermal dissipation assembly 130 includes the thermal dissipation plate 132 from FIGS. 3A-3C sandwiched between a thermal interface layer (TIL) 144 and a thermal barrier layer 146. Other elements can be incorporated into the thermal dissipation assembly 130 as required. For reference, the thermal interface layer 144 is sometimes referred to as a thermal interface material.

The PCBA 118 is mechanically supported relative to the plate 132 using a series of cylindrical standoffs 148 and corresponding threaded fasteners 150. The fasteners 150 extend through the PCB 122 and the standoffs 148 to engage the threaded apertures 134 in the plate 132. The plate 132 is mechanically supported relative to the housing 112 via the aforementioned hinge flanges 140 (FIG. 3C), the thermal barrier layer, and other securement members (not shown).

An integrated circuit (chip) 152 is supported on a lower side of the PCB 122 opposite the side visible in FIG. 2. It is not necessarily required that the PCBA 118 be a double-sided assembly, that is, it is not required that circuit components (e.g. 120, 152) be disposed on both the top and bottom sides of the PCB 122. It is contemplated that the chip 152 is a processing type device that consumes a relatively large amount of electrical power and, in turn, generates a significant amount of heat during operation. An intervening substrate, carrier or other mechanism may support the chip 140 relative to the PCB 122, but such has been omitted from the FIG. 4.

The thermal interface layer (TIL) 144 contactingly engages a distal surface of the chip 152 opposite the PCB 122. The TIL 144 may cover the entirety of the areal extent of the chip 152, or a substantial portion thereof as required. The TIL 144 has a relatively high thermal conductivity and provides a thermally conductive path from the chip 152 to the plate 132. While not limiting, it is contemplated that the TIL 144 has a thermal conductivity of at least about 1.0 W/mK. The TIL 144 can take a variety of forms, including a flexible electrically insulative, thermally conductive layer; a thermal grease; a thermal bond; a thermally conductive silicone pad; a thermally conductive tape; a graphite sheet; a thermally conductive phase change material; a thermoplastic material, a metal layer, etc. If formed of metal, the TIL 144 may comprise a layer of aluminum, copper, silver, etc.

During operation, heat conductively flows from the chip 152, through the TIL 144 and to the plate 132 as represented by arrows 154. The mass of the plate 132 is significantly greater than that of the TIL 144, and has a relatively large surface area to facilitate convective cooling as heat passes from the plate 132 to the surrounding atmospheric air as represented by arrow 156. The use of the cooling fins 136 (FIGS. 3A-3C) and/or forced airflow (e.g., 138 in FIG. 3A) can enhance the convective cooling of the plate 132, which lowers the temperature of the plate and increases the rate of heat conduction through the TIL 144.

The thermal barrier layer 146 mechanically supports and thermally isolates the plate 132 from the housing 112. The thermal barrier layer 146 can take a variety of constructions such as but not limited to flexible or rigid polymers, ceramics, thermally conductive materials, electrically insulative materials, compressive pads, glass, etc. In some cases, the layer 146 is non-thermally conductive material, such as one having a thermal conductivity of less than about 1.0 W/mK. In other cases, the layer 146 is thermally conductive (e.g., equal to or greater than about 1.0 W/mK) but at a level less than the thermal conductivity of the TIL 144. For example, the thermal conductivity of the TIL 144 may be a multiple of (e.g., 3×, 5×, etc.) the thermal conductivity of the barrier layer 146. It is contemplated that the thermal conductivity of the plate 132 will be significantly greater than that of both the TIL 144 and the thermal barrier layer 146.

Those skilled in the art will recognize that heat in a system will generally tend to flow, through conduction, convection and/or radiation, from a higher temperature zone to a lower temperature zone. Depending on the configuration of the system of FIG. 4, substantial amounts of heat may be generated by the HDA 117, and the housing 112 may increase in temperature as a result. The housing has a relatively large mass and surface area and so it is contemplated that a portion of this waste heat will tend to be convectively transferred to the surrounding air, as generally denoted by arrow 158.

In some cases, this heat may be convectively transferred across the intervening air gap between the plate 132 and the housing 112. However, because air is generally non-thermally conductive (e.g., about 0.025 W/mK), and because the thermal barrier layer 146 has a relatively low thermal conductivity, the rate of heat transfer to the plate 132 from the chip will tend to be significantly greater than the amount (if any) of heat transfer to the plate from the housing 112. In this way, the thermal barrier layer 146 will tend to thermally isolate the plate 132 (and hence, the chip 152) from the housing 112, and vice versa.

While not necessarily limiting, the thermal conductivity of the thermal barrier 146 in some cases is selected to be equal to or less than that of atmospheric air. In other cases, the thermal conductivity of the thermal barrier 146 is selected to be greater than that of atmospheric air but less than that of the TIL 144 and the plate 132. In still further cases, the TIL 142 and the thermal barrier layer 146 share a common construction but the thermal barrier layer 146 is substantially thicker than the TIL 144, and so the thermal barrier layer 146 has an overall lower thermal conductance as compared to the TIL 144.

Figure 5:
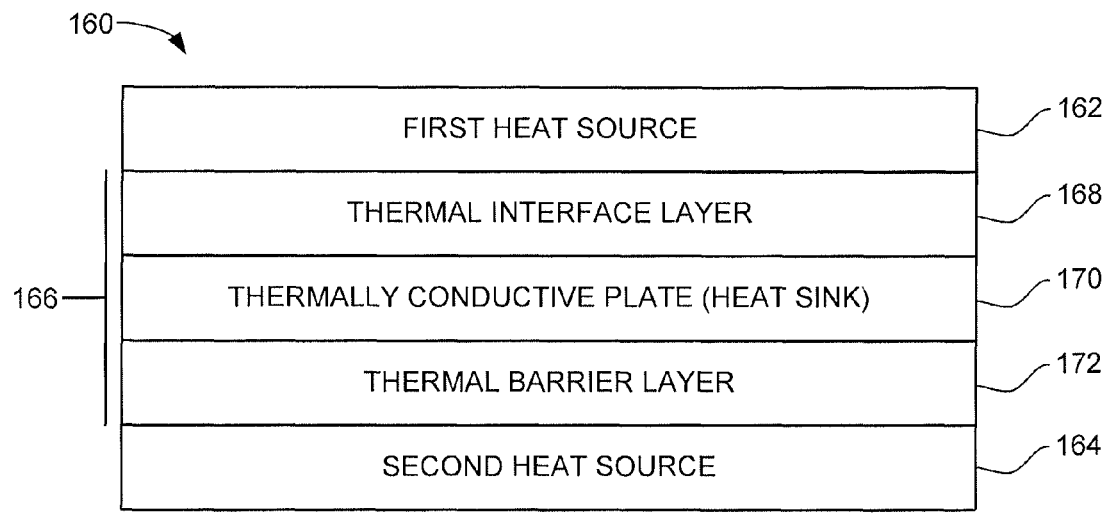
FIG. 5 is a schematic representation of another thermal dissipation scheme in accordance with various embodiments.

FIG. 5 is a schematic depiction of a generalized system 160 that operates in a manner similar to the arrangement of FIG. 4. The system 160 includes a first heat source 162, a second heat source 164, and a thermal dissipation assembly 166 comprising a thermal interface layer 168, a thermally conductive plate (heat sink) 170 and a thermal barrier layer 172. The respective sizes and areal extents of the respective elements can vary. As noted above, the thermal interface layer 168 facilitates the efficient conduction of heat from the first heat source 162 to the plate 170, and the thermal barrier layer mechanically supports and thermally isolates the plate 170 from the second heat source 164.

Figure 6:
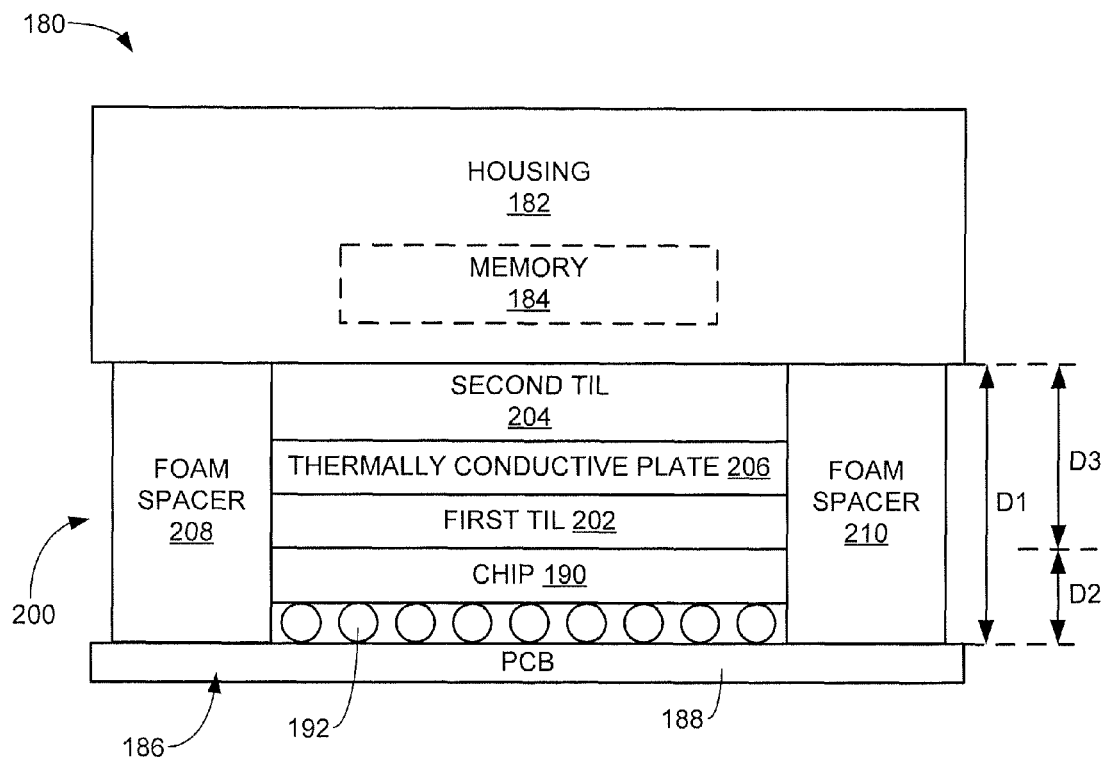
FIG. 6 is a schematic representation of another thermal dissipation scheme in accordance with some embodiments.

FIG. 6 illustrates another data storage device 180 in accordance with some embodiments. The data storage device 180 is similar to the device 110 discussed above. As before, the sizes and aspect ratios represented in FIG. 6 are merely for purposes of illustration and are not drawn to scale.

The device 180 includes a housing 182 which encloses a memory element 184, and a printed circuit board assembly (PCBA) 186 that supplies control electronics for the memory element 184 as well as other elements disposed within the housing. The PCBA 186 includes a planar printed circuit board (PCB) 188 and at least one integrated circuit (chip) 190 supported by a ball grid array (BGA) interconnection mechanism 192. As before, it is contemplated that the PCBA 186 in general, and the chip 190 in particular, is a source of heat and may undergo a significant increase in temperature during operation.

A thermal dissipation assembly 200 includes first and second layers of thermal interface material 202, 204 (referred to as "first TIL" and "second TIL," respectively) and an intervening thermally conductive plate 206. In some embodiments, the first and second TIL layers 202, 204 each generally comprise flexible sheets of electrically insulative and thermally conductive material.

In some cases, the respective layers 202, 204 share a common overall construction, but the second TIL 204 is thicker than the first first TIL 202 so that the overall thermal conductance of the second TIL is lower than that of the first TIL. As with the other embodiments discussed above, the respective TIL layers can each comprise a single layer or multiple layers of the same or different material.

The thermal dissipation assembly 200 further includes opposing foam spacers 208, 210 which are compressed between the housing 182 and the PCB 188 and contactingly engage and retain the respective TIL layers 202, 204 and the plate 206. The foam spacers 208, 210 are open or closed cell foam members of electrically insulating material. The spacers 208, 210 can be arranged on opposing sides of the plate 206 as shown, or can surround additional sides. Generally, however, it is contemplated that at least one side will remain open and exposed to the surrounding environment for purposes of heat convection from the plate 206. Other types of retention features can be used used in lieu of the foam spacers 208, 210.

As before, heat generated by the chip 190 is conducted through the first TIL 202 to the plate 206, and the second TIL 204 serves as a thermal barrier to thermally isolate the plate 206 from the housing 182. Although not shown in FIG. 6, the plate 206 can have the same areal extent as the respective TIL layers 202, 204, or can extend beyond the TIL layers 202, 204 to provide additional exposed airflow contact to facilitate convective cooling.

The arrangement of FIG. 6 is particularly suitable for low profile applications where a relatively small amount of space is available between the PCBA 186 and the housing 182. In some embodiments, the distance D1 from the PCB 188 to the housing 182 is about 0.136 inches (136 mils), the distance D2 from a facing surface of the PCB 188 to a facing surface of the chip 190 is about 0.053 inches (53 mils), and the distance from the facing surface of the chip 190 to the housing 182 is about 0.083 inches (83 mils).

In some cases, the arrangement of FIG. 6 is configured to maintain an operational temperature of the chip 190 at a level of about 45 degrees Celsius or lower. In other cases, the arrangement of FIG. 6 is configured to maintain an operational temperature of the chip 190 at a level equal to or lower than that of the housing 182.

Figure 7:
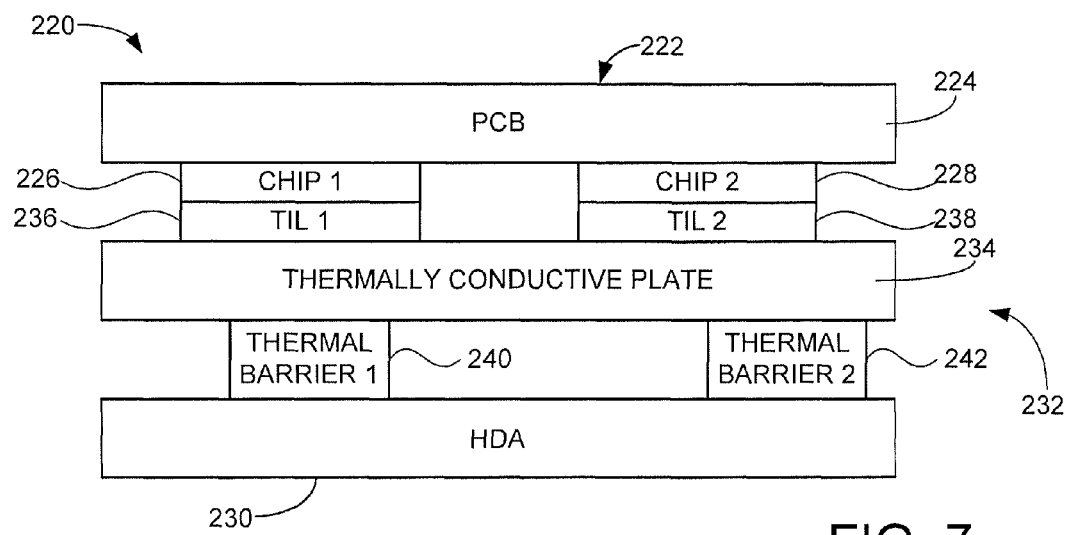
FIG. 7 is a schematic representation of another thermal dissipation scheme in accordance with some embodiments.

FIG. 7 is a schematic representation of another system 220 in accordance with some embodiments. In this configuration, a PCBA 222 includes a PCB 224 which supports a first electronic component (chip 1) 226 and a second electronic component (chip 2) 228. The PCBA 222 provides control electronics for an adjacent head disc assembly (HDA) 230.

A thermal dissipation assembly 232 is interposed between the PCBA 222 and the HDA 230 and includes a thermally conductive plate 234; first and second thermal interface material (TIL) layers 236, 238 that are contactingly disposed between the respective chips 226, 228 and the plate 234; and first and second thermal barrier layers 240, 242 contactingly disposed between the plate 234 and the HDA 230. More generally, any suitable respective numbers of thermal interface layers and thermal barrier layers can be used, including different numbers of each, and the respective layers can be placed in various axially aligned (e.g., 236, 240) or non-aligned (e.g., 238, 242) locations as required.

In FIG. 7, the respective first and second TIL layers 236, 238 may share a common thermal conductivity, or may have different thermal conductivities in relation to differences in the amount of heat generated by the respective chips 226, 228. As before, the thermal barrier layers 240, 242 each have a thermal conductivity less than those of the first and second TIL layers 236, 238 and thermally isolate the plate 234 from the HDA 230. The relatively high thermal impedance(s) of the barrier layers 240, 242 effectively provide thermal isolation between the HDA 230 and the plate 234, while the relatively low thermal impedance(s) of the TIL layers 236, 238 provide efficient conduction of heat from the chips 226, 228 to the plate 234.

While the various embodiments described herein have been in the environment of a data storage device, such is merely illustrative and not limiting. Any number of different types of electrical, electronic, and/or heat generating devices can be configured to incorporate the features of the various disclosed embodiments as desired.

It is to be understood that even though numerous characteristics and advantages of various embodiments of the present disclosure have been set forth in the foregoing description, together with details of the structure and function of various embodiments disclosed, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising a thermal dissipation assembly disposed between first and second heat sources, the thermal dissipation assembly comprising a thermally conductive plate disposed between axially aligned first and second thermal interface structures, the first thermal interface structure having a thermal conductivity greater than the second thermal interface structure, the thermally conductive plate having a thermal conductivity greater than the first thermal interface structure, the second thermal interface structure disposed between first and second air gaps, the first and second air gaps disposed between the thermally conductive plate and the second heat source.

2. The apparatus of claim 1, wherein the first and second thermal interface structures each comprise a first material.

3. The apparatus of claim 1, wherein the first and second thermal interface structures comprise different materials.

4. The apparatus of claim 1, wherein the first thermal interface structure has a thickness smaller than the second thermal interface structure, a thickness of each of the first and second thermal interface structures is measured parallel to a direction from the first heat source to the second heat source.

5. The apparatus of claim 1, wherein each of the first and second thermal interface structures has a thermal conductivity greater than 1 W/mK.

6. The apparatus of claim 1, wherein the first thermal interface structure comprises a thermal grease.

7. The apparatus of claim 1, wherein the first thermal interface structure comprises a thermally conductive silicone pad.

8. The apparatus of claim 1, wherein the first thermal interface structure comprises a thermally conductive phase change material, a thermoplastic material, or a metal material.

9. The apparatus of claim 1, wherein the first thermal interface structure comprises a lamination of multiple different materials.

10. An apparatus comprising a thermal dissipation assembly disposed between first and second heat sources, the thermal dissipation assembly comprising a thermally conductive plate disposed between first and second thermal interface structures and between third and fourth thermal interface structures, the first and second thermal interface structures being axially aligned and the third and fourth thermal interface structures being axially aligned, the first and third thermal interface structures respectively having thermal conductivities greater than the second and fourth thermal interface structures, the thermally conductive plate having a thermal conductivity greater than each of the first and second thermal interface structures.

11. The apparatus of claim 10, wherein the first thermal interface structure contacts a first integrated circuit component of the first heat source and the third thermal interface structure contacts a second integrated circuit component of the first heat source.

12. The apparatus of claim 10, wherein the first and third thermal interface structures are separated by a first air gap and the second and fourth thermal interface structures are separated by a second air gap.

13. The apparatus of claim 10, wherein the first heat source comprises a printed circuit board and the second heat source comprises a data storage device housing.

14. The apparatus of claim 10, wherein the thermally conductive plate comprises a material different than each of the first, second, third, and fourth thermal interface structures.

15. The apparatus of claim 10, wherein the first, second, third, and fourth thermal interface structures each comprise a flexible, electrically insulative material.

16. The apparatus of claim 10, wherein each of the first and third thermal interface structures comprise a lamination of multiple different materials.

17. A system comprising a thermal dissipation assembly disposed between a hard disc drive and a circuit board, the hard disc drive and the circuit board separated by 0.136 inches or less, the thermal dissipation assembly comprising a thermally conductive plate disposed between axially aligned first and second thermal interface structures, the first thermal interface structure having a thermal conductivity greater than the second thermal interface structure, the thermally conductive plate having a thermal conductivity greater than the first thermal interface structure.

18. The system of claim 17, wherein the thermally conductive plate is separated from the hard disc drive by 0.053 inches or less.

19. The system of claim 17, wherein the thermally conductive plate is separated from the circuit board by 0.083 inches or less.

20. The system of claim 17, wherein the hard disc drive, the thermal dissipation assembly, and the circuit board collectively form a data storage device.

\* \* \* \* \*